United States Patent
Paavola

(10) Patent No.: US 11,576,282 B2
(45) Date of Patent: Feb. 7, 2023

(54) COLD PLATE ATTACHMENT WITH STABILIZING ARM

(71) Applicant: Intel Corporation, Santa Clara, CA (US)

(72) Inventor: Juha Tapani Paavola, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 17/358,156

(22) Filed: Jun. 25, 2021

(65) Prior Publication Data

US 2021/0321541 A1    Oct. 14, 2021

(51) Int. Cl.
  *H05K 7/20* (2006.01)
  *G06F 1/20* (2006.01)
  *H05K 7/14* (2006.01)

(52) U.S. Cl.
  CPC ......... *H05K 7/20509* (2013.01); *G06F 1/203* (2013.01); *H05K 7/1417* (2013.01)

(58) Field of Classification Search
  None
  See application file for complete search history.

(56) References Cited

U.S. PATENT DOCUMENTS

| 6,313,995 | B1* | 11/2001 | Koide | H05K 7/20509 |
| | | | | 174/16.3 |
| 7,187,553 | B2* | 3/2007 | Schmidberger | H01L 23/4006 |
| | | | | 257/E23.09 |
| 9,076,769 | B2* | 7/2015 | Chen | H01L 23/467 |
| 2010/0181049 | A1* | 7/2010 | Chen | G06F 1/20 |
| | | | | 165/104.26 |
| 2013/0070418 | A1* | 3/2013 | Lee | H01L 23/4006 |
| | | | | 361/720 |

* cited by examiner

*Primary Examiner* — Mukundbhai G Patel
(74) *Attorney, Agent, or Firm* — Patent Capital Group

(57) ABSTRACT

Particular embodiments described herein provide for an electronic device that can be configured to include a printed circuit board, a heat source located on the printed circuit board, a cold plate over the heat source, and a pair of cold plate attachments with stabilizing arms. Each of the pair of cold plate attachments with stabilizing arms include a printed circuit board attachment portion secured to the printed circuit board using only a single through hole, a load portion that extends from the printed circuit board attachment portion towards the cold plate, a cold plate attachment portion that secures the cold plate attachment with stabilizing arm to the cold plate, and a stabilizing portion that extends from the cold plate attachment portion to the printed circuit board.

20 Claims, 9 Drawing Sheets

COLD PLATE ATTACHMENT WITH STABILIZING ARM

TECHNICAL FIELD

This disclosure relates in general to the field of computing and/or device cooling, and more particularly, to a cold plate attachment with stabilizing arm.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1A:
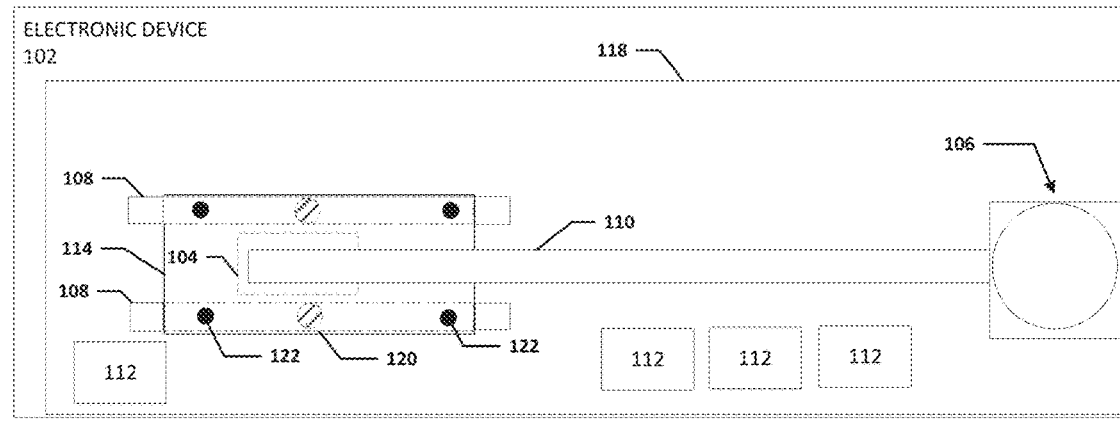
FIG. 1A is a simplified block diagram of an electronic device that include a cold plate attachment with stabilizing arm, in accordance with an embodiment of the present disclosure.

The FIGURES of the drawings are not necessarily drawn to scale, as their dimensions can be varied considerably without departing from the scope of the present disclosure.

DETAILED DESCRIPTION

The following detailed description sets forth examples of apparatuses, methods, and systems relating to enabling a cold plate attachment with stabilizing arm. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer or component disposed over or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component "directly on" a second layer or second component is in direct contact with that second layer or second component. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

Furthermore, the term "connected" may be used to describe a direct connection between the things that are connected, without any intermediary devices, while the term "coupled" may be used to describe either a direct connection between the things that are connected, or an indirect connection through one or more intermediary devices. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−20% of a target value based on the context of a particular value as described herein or as known in the art.

FIG. 1A is a simplified block diagram of electronic device that include a cold plate attachment with stabilizing arm, in accordance with an embodiment of the present disclosure. In an example, an electronic device 102 can include a heat source 104, a heatsink 106, cold plate attachments with stabilizing arms 108, a heat pipe 110, one or more electronic components 112, and a cold plate 114. The cold plate attachments with stabilizing arms 108 can be attached to the cold plate 114. Each of the cold plate attachments with stabilizing arms 108 can be secured to a support structure 118 using a support structure fastener 120. As illustrated in FIG. 1A, the support structure fastener 120 can be located in an approximate middle or center portion of the support structure fastener 120 and the cold plate attachment with stabilizing arm 108. In addition, each of the cold plate attachments with stabilizing arms 108 can be secured to the cold plate using cold plate fasteners 122.

The heatsink 106 helps to remove the heat collected by the heat pipe 110 and can be an active heatsink or a passive heatsink. The heat source 104 may be a heat generating device (e.g., processor, logic unit, field programmable gate array (FPGA), chip set, integrated circuit (IC), a graphics processor, graphics card, battery, memory, or some other type of heat generating device). Each of the electronic components 112 can be a device or group of devices available to assist in the operation or function of the electronic device 102. The cold plate 114 can be a heat spreader, vapor chamber, cold pipe, heat transfer pedestal, or some other thermal solution that can be coupled to the cold plate attachments with stabilizing arm 108 and help to transfer heat away from the heat source 104. The support structure 118 can be a printed circuit board (PCB).

Figure 1B:
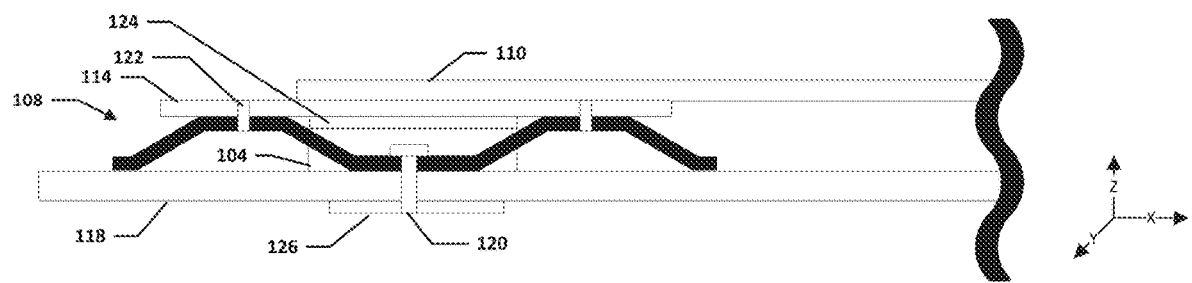
FIG. 1B is a simplified block diagram side view of a portion of an electronic device that include a cold plate attachment with stabilizing arm, in accordance with an embodiment of the present disclosure.

Turning to FIG. 1B, FIG. 1B is a simplified block diagram of a side view of a portion of an electronic device that includes the cold plate attachment with stabilizing arm 108, in accordance with an embodiment of the present disclosure. As illustrated in FIG. 1B, the cold plate attachment with stabilizing arm 108 can be over the heat source 104. In some examples, a thermal interface material (TIM) 124 is between the heat source 104 and the cold plate 114. The heat pipe 110 can be over the cold plate 114.

The cold plate attachment with stabilizing arm 108 can be secured to the cold plate 114 using cold plate fasteners 122. In some examples, the cold plate fasteners 122 can extend through the cold plate 114. In other examples, the cold plate fasteners 122 may be solder, tape, a weld, a mechanical locking feature, or some other material that can help to couple the cold plate attachment with stabilizing arm 108 to the cold plate 114 and pull the cold plate 114 towards the support structure 118 and the heat source 104.

In addition, the cold plate attachment with stabilizing arm 108 can be secured to the support structure 118 using a support structure fastener 120. As illustrated in FIG. 1B, the support structure fastener 120 can be located in an approximate middle or center portion of the support structure fastener 120 and the cold plate attachment with stabilizing arm 108. The support structure fastener 120 can go through the support structure 118 to help secure the cold plate attachment with stabilizing arm 108 to the support structure 118. In some examples, a support plate 126 can be under the support structure 118 and function as a stiffener to help provide stiffness to the support structure 118 and allow for uniform pressure or load profile on the support structure 118. If present, the support plate 126 can help reduce or prevent solder joint failure and can help to prevent or reduce high loading on the support structure 118, which can help reduce or prevent cracking or damaging the support structure 118.

When the cold plate attachment with stabilizing arm 108 is secured to the support structure 118, a portion of the cold plate attachment with stabilizing arm 108 extends from the support structure 118 to the cold plate 114 at an angle to create a bending moment that generates a desired pressure or load on the cold plate 114. Because the cold plate attachment with stabilizing arm 108 is secured to the cold plate 114 and generates a pressure of load on the cold plate 114, the cold plate attachment with stabilizing arm 108 pulls the cold plate 114 towards the support structure 118 and onto the heat source 104 that is over the support structure 118.

Also, a portion of the cold plate attachment with stabilizing arm 108 extends from the cold plate 114 back to the support structure 118 and acts as stabilizing arms to help create an even pressure on the heat source 104 and the TIM 124 from the cold plate 114. The portion of the cold plate attachment with stabilizing arm 108 that extends from the cold plate 114 back to the support structure 118 is not secured to the support structure 118 but rather sits on the support structure 118 and functions as a stabilizing spring like structure that stabilizes the cold plate 114 and evens out the pressure on the heat source 104 from the cold plate 114. Because the portion of the cold plate attachment with stabilizing arm 108 that extends from the cold plate 114 back to the support structure 118 is not secured to the support structure 118 but rather sits on the support structure 118, traces and other components can be located on the support structure 118 under the area of the cold plate attachment with stabilizing arm 108. In addition, there is only one through hole in the support structure 118 for each of the cold plate attachments with stabilizing arms 108.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. Further, the appearances of the phrase "in one example" or "in an example" are not necessarily all referring to the same examples.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function while having a relatively thin profile. However, the increase in performance and/or function causes an increase in the thermal challenges of the devices and systems, especially for relatively thin electronic devices. In addition, as more computing elements are packed into the systems, finding room to secure components to a support structure like a printed circuit board (PCB) can become difficult as space is limited.

The requirement of increased performance in thin systems possess challenge on designing thermal solutions that occupy a relatively small footprint on the support structure and still produce the necessary load to achieve a thin and uniform layer of TIM and uniform pressure on the heat source to allow for desired thermal performance. Insufficient pressure or loading on the heat source limits the choice of TIM that may be used in the system. TIMs used for low load applications generally have higher thermal resistance compared to TIMs used for higher loads. The TIMs for low load applications can cause a reduction in device performance and delays in data throughput.

One current way thermal performance targets are typically achieved is by decreasing the thermal resistance between the heat source and the cold plate. The thermal resistance between the heat source and the cold plate is typically decreased by either increasing the load on the heat source from the cold plate or by changing to a different TIM that exhibits reduced thermal resistance for the same pressure, which may be nearing a point of diminishing returns for state-of-the-art grease TIMs, and/or can be cost-prohibitive for high volume manufacture for fundamentally new classes of TIMs (e.g., liquid metal). In addition, to achieve thermal performance targets, some other currently used systems increase the thermal capacitance of the system in the vicinity of the heat source. The increase in the thermal capacitance of the system in the vicinity of the heat source is typically achieved by increasing the thickness of the cold plate or heat spreader. However, this can have a direct impact on the overall system thickness and Z-height. The term "Z height," "Z location," etc. refers to the height along the "Z" axis of an (x, y, z) coordinate axis or cartesian coordinate system.

Most typical thermal solution designs involve using a heat pipe and copper spreader in combination with attachment springs to try and obtain a desired loading. The attachment springs are usually are made of steel which deflect a defined distance to provide the desired load on the heat source and help to create a uniform thickness of TIM. The heat pipe, copper spreader, and attachment spring are usually stacked in layers.

Some common typical thermal solutions (cold plate and heat pipe) are attached by a four-point attachment system that includes four leaf springs and four screws to create a desired amount of pressure on the cold plate and on the TIM and the heat source. Typically, the leaf springs extend relatively far away from the cold plate to generate a bending moment to create the desired pressure on the cold plate, TIM, and heat source. In addition, the leaf springs are attached to the PCB using four through holes in the PCB and the four through holes prevent trace routing around the through hole area. The four-leaf springs and screws create keep out zones on the PCB and limit where other components of the electronic device can be located on the PCB and the leaf springs and four screws take up valuable space on the PCB. In addition, there can be a relatively higher costs due to the high number of attachment points.

Some systems use a three-point attachment system, because the reduction of one through hole will decrease the keep out zone size and allow for relatively easier routing in PCB layers because in a three-point attachment system, one through hole is removed as compared to the four-point attachment system that requires four through holes in the PCB. However, the three-point attachment system typically does not produce a smooth pressure or an even distribution of the pressure from the cold plate as compared to the four-point attachment system. Also, in a three-point attachment system, the leaf arm is longer on one side and that can cause cold plate bending. Further, with a three-point attachment system, the cold plate is not typically saddled properly on the TIM and heat source and does not create a desired uniform pressure on the TIM and heat source. In addition, the screw locations for most three-point attachment systems are relatively far away from the cold plate and this can generate a bending moment that deflects the cold plate and decreases the thermal performance of the cold plate. To further reduce the amount of through holes in the PCB, some systems use a two-point attachment. However, as with the three-point attachment system, with some current two-point attachment systems, the cold plate can easily tilt and put pressure on one side of the TIM and heat source and almost none on the other side of the TIM and heat source. What is needed is a cold plate attachment with a stabilizing arm that can provide an even distribution of force on the TIM and heat source while also using less than four points of attachment to the PCB.

A device that includes a cold plate attachment with a stabilizing arm, as outlined in FIG. 1, can resolve these issues (and others). In an example, a cold plate attachment with stabilizing arm (e.g., the cold plate attachment with stabilizing arm 108) can be secured to a cold plate (e.g., the cold plate 114). The cold plate can be a heat spreader, vapor chamber, cold pipe, heat transfer pedestal, or some other thermal solution that can be coupled to the cold plate attachments with stabilizing arm and help to transfer heat away from a heat source. The cold plate attachment with stabilizing arm is also secured to the support structure using only one attaching through hole (e.g., a rivet, screw, etc.) per cold plate attachment stabilizing arm in the middle or center portion of the length of the cold plate attachment with stabilizing arm. The cold plate attachment with stabilizing arm can be attached to the cold plate with a rivet or screw going through the cold plate, can be soldered to the cold plate, can be coupled to the cold plate with a mechanical locking feature, or some other means or mechanism that secures the cold plate attachment with stabilizing arm to the cold plate. The cold plate attachment with stabilizing arm extends from the support structure to the cold plate at an angle to create a bending moment that generates a desired pressure of load on the cold plate and the generated pressure or load pulls the cold plate towards the support structure and onto a heat source. In addition, the cold plate attachment with stabilizing arm extends from the cold plate to the support structure at an angle to create a counter force that stabilizes the cold plate.

The ends of the cold plate attachment with stabilizing arm that extend to the support structure function similar to stabilizing springs. However, the cold plate attachment with stabilizing arm could include a separate leaf spring, coil spring, elastic support, or any other type of stabilizing structure that can help to stabilize the cold plate and help to create an even pressure on a heat source. The profile of the cold plate attachment with stabilizing arm can reduce the size of the keep out zone as compared to a four-point attachment system that includes four leaf springs and four through holes described above or the three-point attachment system described above. The mid screw connection in the middle of the length of the cold plate attachment with stabilizing arm enables the cold plate attachment with stabilizing arm to be located under the cold plate and can help to reduce the bending moment and the deflection of the cold plate as compared to the three-point attachment system. This reduces the amount of board space occupied by the cold plate attachment.

In addition to the ends of the cold plate attachment with stabilizing arm functioning as a stabilizing spring, one or both ends of the cold plate attachment with stabilizing arm can also be used for grounding where one or both of the ends of the cold plate attachment with stabilizing arm are in contact with a ground plane or ground. The length of the cold plate attachment with stabilizing arm from the cold plate to the support structure can be shorter than the length of the stabilizing arm from the support structure to the cold plate. The length of the stabilizing arm from the cold plate to the support can even be entirely under the cold plate. In some examples, the length of the cold plate attachment with stabilizing arm from the cold plate to the support structure can be half the length of the length of the stabilizing arm from the support structure to the cold plate. The cold plate attachment with stabilizing arm can be metal, plastic (to be used in relatively low temperature systems as plastic could degrade easily in a relatively high temperature system), carbon fiber, or some other material that can help pull the cold plate onto the TIM and heat source and can help stabilize and/or even out the pressure applied by the cold plate to the TIM and heat source.

Figure 2:
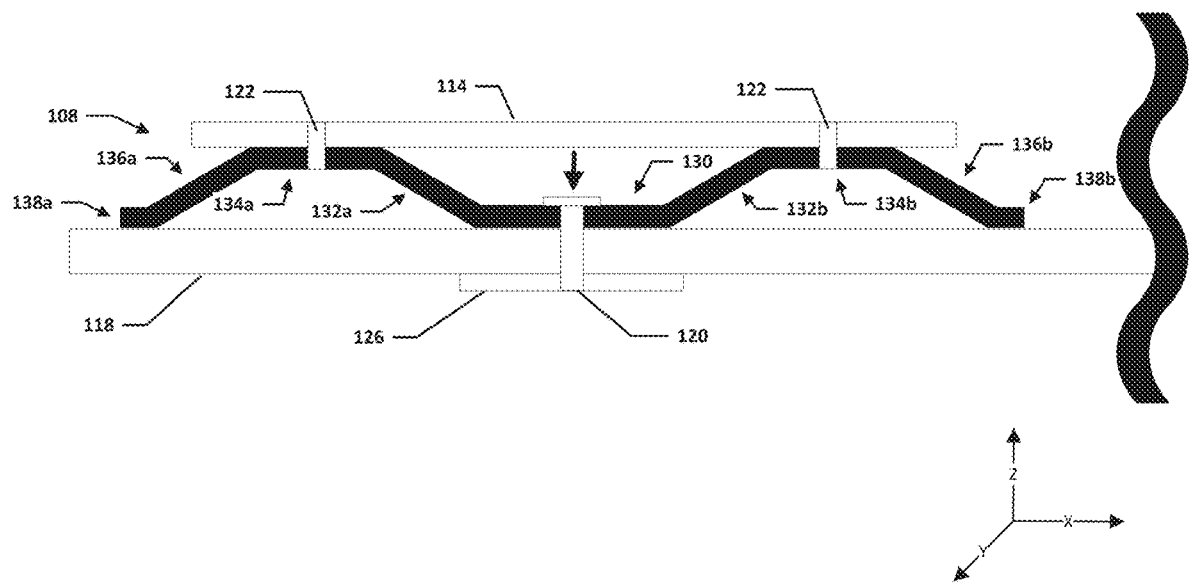
FIG. 2 is a simplified block diagram side view of a portion of a system to enable a cold plate attachment with stabilizing arm, in accordance with an embodiment of the present disclosure.

Turning to FIG. 2, FIG. 2 is a simplified side view of the cold plate with stabilizing arm 108, in accordance with an embodiment of the present disclosure. The cold plate with stabilizing arm 108 can include a support structure attachment portion 130, a load portion 132, a cold plate attachment portion 134, a stabilizing portion 136, and feet 138. More specifically, as illustrated in FIG. 2, the cold plate attachment with stabilizing arm 108 can include the support structure attachment portion 130, a first load portion 132a, a second load portion 132b, a first cold plate attachment portion 134a, a second cold plate attachment portion 134b, a first stabilizing portion 136a, a second stabilizing portion 136b, a first foot 138a, and a second foot 138b.

The cold plate attachment with stabilizing arm 108 can be coupled to the support structure 118 using the support structure fastener 120. In an example, as illustrated in FIG. 2, the support structure fastener 120 can go through the support structure attachment portion 130 and through the support structure 118. In some examples, the support structure fastener 120 can also go through a support plate 126. If present, the support plate 126 can be a stiffener to help provide stiffness to the support structure 118.

As illustrated in FIG. 2, the first load portion 132a of the cold plate attachment with stabilizing arm 108 can extend from the support structure attachment portion 130 to the first cold plate attachment portion 134a and the second load portion 132b can extend from the support structure attachment portion 130 to the second cold plate attachment portion 134b. The first cold plate attachment portion 134a and the second cold plate attachment portion 134b of the cold plate attachment with stabilizing arm 108 can be coupled to the cold plate 114 using the cold plate fasteners 122. Due to the angle, shape, material, etc. of the first load portion 132a and the second load portion 132b, a bending moment is created that generates a pressure or load on the cold plate 114 and the cold plate 114 is pulled towards the support structure 118 by the first load portion 132a and the second load portion 132b of the cold plate attachment with stabilizing arm 108 to help create pressure on the heat source 104 (not shown) from the cold plate 114. For example, the first load portion 132a and the second load portion 132b of the cold plate attachment with stabilizing arm 108 can help to create a force on the cold plate 114 in the direction of the support structure 118 to help create pressure on the heat source 104 (not shown) from the cold plate 114.

In addition, as illustrated in FIG. 2, the first stabilizing portion 136a of the cold plate attachment with stabilizing arm 108 can extend from the first cold plate attachment portion 134a to the support structure 118 and the second stabilizing portion 136b of the cold plate attachment with stabilizing arm 108 can extend from the second cold plate attachment portion 143b to the support structure 118. Due to the angle, shape, material, etc. of the first stabilizing portion 136a and the second stabilizing portion 136b, a counter force on the cold plate 114 is created. The counter force can help stabilizes the cold plate 114 and even out the force from the first load portion 132a and the second load portion 132b to help create an even pressure on the heat source 104 (not shown) from the cold plate 114.

Also, as illustrated in FIG. 2, the first foot 138a of the cold plate attachment with stabilizing arm 108 can extend from the first stabilizing portion 136a and the second foot 138b of the cold plate attachment with stabilizing arm 108 can extend from the second stabilizing portion 136b. The first foot 138a and the second foot 138b can extend along a plane that is substantially parallel to a plane that includes a surface of the support structure 118. The first foot 138a and the second foot 138b are not attached, coupled, or otherwise secured to the support structure 118 so no additional holes are created in the support structure and traces can extend in and around the location of the first foot 138a and the second foot 138b. The first foot 138a and the second foot 138b of the cold plate attachment with stabilizing arm 108 help to stabilize the first stabilizing portion 136a and the second stabilizing portion 136b of the cold plate attachment with stabilizing arm 108 and help create an even pressure on the heat source 104 from the cold plate 114 without the need of through holes in the support structure 118.

Figure 3:
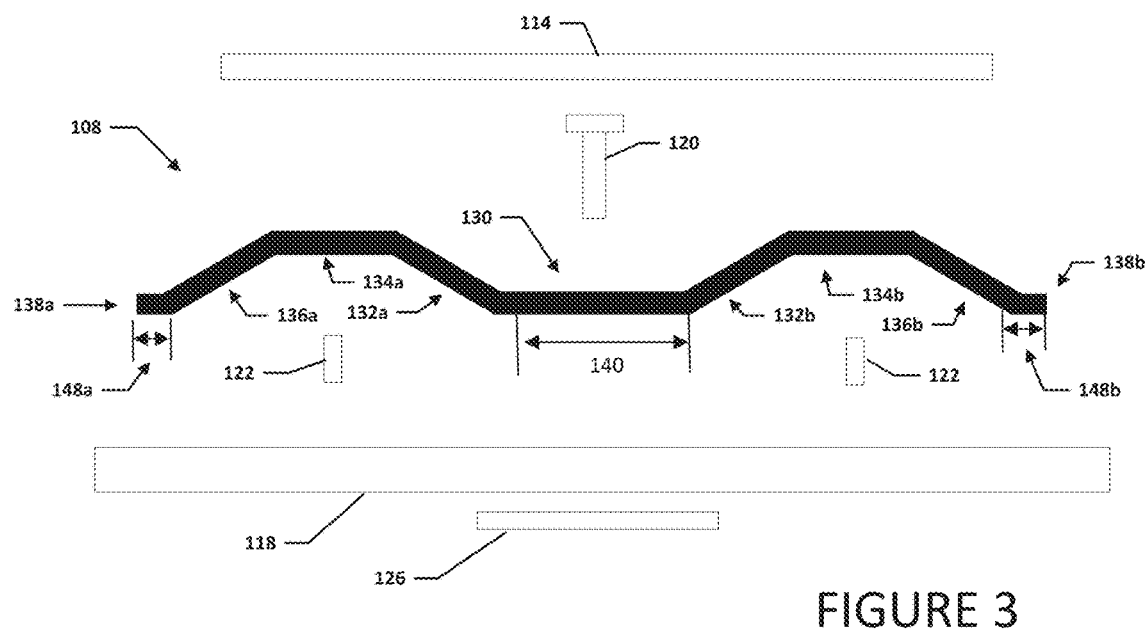
FIG. 3 is a simplified block diagram exploded view of a portion of a system to enable a cold plate attachment with stabilizing arm, in accordance with an embodiment of the present disclosure.

Turning to FIG. 3, FIG. 3 is a simplified exploded side view of the cold plate with stabilizing arm 108, in accordance with an embodiment of the present disclosure. The cold plate with stabilizing arm 108 can include a support structure attachment portion 130, a load portion 132, the cold plate attachment portion 134, the stabilizing portion 136, and the feet 138. More specifically, as illustrated in FIG. 3, the cold plate attachment with stabilizing arm 108 can include the support structure attachment portion 130, the first load portion 132a, the second load portion 132b, the first cold plate attachment portion 134a, the second cold plate attachment portion 134b, the first stabilizing portion 136a, the second stabilizing portion 136b, the first foot 138a, and the second foot 138b.

The cold plate attachment with stabilizing arm 108 can be coupled to the support structure 118 using the support structure fastener 120. The support plate 126 can be a stiffener to help provide stiffness to the support structure 118. As illustrated in FIG. 3, the first load portion 132a of the cold plate attachment with stabilizing arm 108 can extend from the support structure attachment portion 130 to the first cold plate attachment portion 134a and the second load portion 132b of the cold plate attachment with stabilizing arm 108 can extend from the support structure attachment portion 130 to the second cold plate attachment portion 134b. The first cold plate attachment portion 134a and the second cold plate attachment portion 134b of the cold plate attachment with stabilizing arm 108 can be coupled to the cold plate 114 using the cold plate fasteners 122. In addition, as illustrated in FIG. 3, the first stabilizing portion 136a of the cold plate attachment with stabilizing arm 108 can extend from the first cold plate attachment portion 134a to the support structure 118 and the second stabilizing portion 136b of the cold plate attachment with stabilizing arm 108 can extend from the second cold plate attachment portion 143b to the support structure 118. Also, as illustrated in FIG. 3, the first foot 138a of the cold plate attachment with stabilizing arm 108 can extend from the first stabilizing portion 136a and the second foot 138b of the cold plate attachment with stabilizing arm 108 can extend from the second stabilizing portion 136b along a plane that is substantially parallel to a plane that includes a surface of support structure 118. The first foot 138a and the second foot 138b are not attached, coupled, or otherwise secured to the support structure 118 so no additional holes are created in the support structure and traces can extend in and around the location of the first foot 138a and the second foot 138b.

Figure 4:
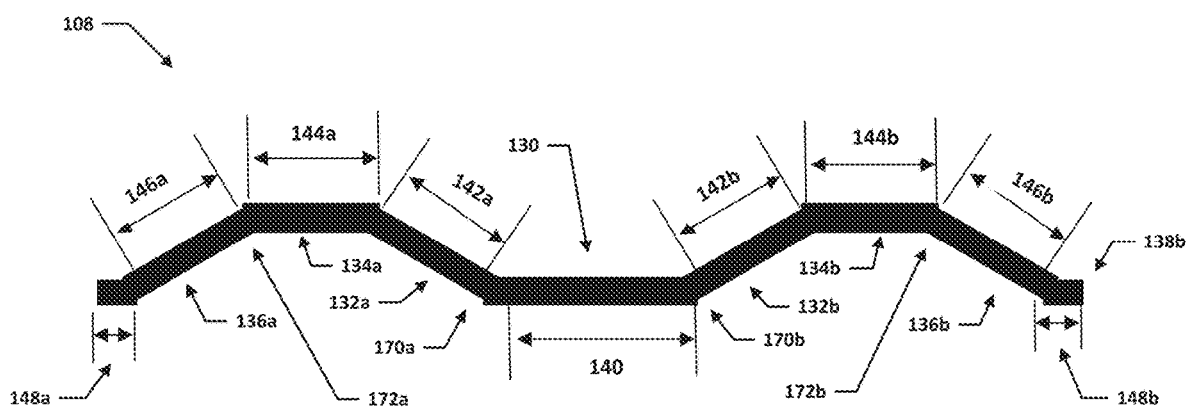
FIG. 4 is a simplified block diagram side view of a portion of a system to enable a cold plate attachment with stabilizing arm, in accordance with an embodiment of the present disclosure.

Turning to FIG. 4, FIG. 4 is a simplified side view of the cold plate with stabilizing arm 108, in accordance with an embodiment of the present disclosure. The cold plate with stabilizing arm 108 can include a support structure attachment portion 130, a load portion 132, a cold plate attachment portion 134, a stabilizing portion 136, and feet 138. More specifically, as illustrated in FIG. 4, the cold plate attachment with stabilizing arm 108 can include the support structure attachment portion 130, a first load portion 132a, a second load portion 132b, a first cold plate attachment portion 134a, a second cold plate attachment portion 134b, a first stabilizing portion 136a, a second stabilizing portion 136b, a first foot 138a, and a second foot 138b.

The support structure attachment portion 130 can have a length 140 that allows the support structure attachment portion 130 to provide a secure attachment to the support structure 118. In an illustrative example, the length 140 of the support structure attachment portion 130 may be between about five (5) millimeters and about fifty (50) millimeters and ranges therein (e.g., between about twenty (20) and about fourth (40) millimeters, or between about five (5) and about ten (10) millimeters), depending on design choice and design constraints. The load portion 132 can have a length 142 and an angle 170 relative to the support structure attachment portion 130 that allows the load portion 132 to pull the cold plate 114 towards the support structure 118. More specifically, the first load portion 132a can have a length 142a and an angle 170a relative to the support structure attachment portion 130. The second load portion 132b can have a length 142b and an angle 170b relative to the support structure attachment portion 130. In an example, the length 142a and angle 170a of the first load portion 132a may be the same length as the length 142b and angle 170b of the second load portion 132b. In another example, the length 142a and angle 170b of the first load portion 132a may be a different length than the length 142b of the second load portion 132b and/or have a different angle than the angle 170b of the second load portion 132b. In an illustrative example, the length 142a of the first load portion 132a and the length 142b of the second load portion 132b may be between about one (1) millimeter to about twenty-five (25) millimeters and ranges therein (e.g., between about five (5) and about twenty (20) millimeters, or between about ten (10) and about fifteen (15) millimeters), depending on design choice and design constraints. In some examples, the angle 170a of the first load portion 132a and the angle 170b of the second load portion 132b may be between about one degree (1°) to about forty-five degrees (45°) relative to the support structure attachment portion 130 and ranges therein (e.g., between about five degrees (5°) and about twenty degrees (20°), or between about ten degrees (10°) and about forty degrees (40°)), depending on design choice and design constraints. The length 142a of the first load portion 132a, the length 142b of the second load portion 132b, the angle 170a of the first load portion 132a relative to the support structure attachment portion 130, and the angle 170b of the second load portion 132b relative to the support structure attachment portion 130 depends on design constraints and the desired force to pull the cold plate 114 towards the support structure 118 cold plate 114. The length 142a of the first load portion 132a and the length 142b of the second load portion 132b do not need to be the same or equal. The angle 170a of the first load portion 132a relative to the support structure attachment portion 130, and the angle 170b of the second load portion 132b relative to the support structure attachment portion 130 do not need to be the same or equal.

The cold plate attachment portion 134 can have a length 144 that allows the cold plate attachment portion 134 to provide a secure attachment to the cold plate 114. More specifically, the first cold plate attachment portion 134a can have a length 144a and the second cold plate attachment portion 134b can have a length 144b. In an example, the length 144a of the first cold plate attachment portion 134a may be the same length as the length 144b of the second cold plate attachment portion 134b. In another example, the length 144a of the first cold plate attachment portion 134a may be a different length than the length 144b of the second cold plate attachment portion 134b. In an illustrative example, the length 144a of the first cold plate attachment portion 134a and the length 144b of the second cold plate attachment portion 134b may be between about five (5) millimeters to about twenty-five (25) millimeters and ranges therein (e.g., between about five (5) and about twenty (20) millimeters, or between about ten (10) and about fifteen (15) millimeters), depending on design choice and design constraints.

The stabilizing portion 136 can have a length 146 and an angle 172 relative to the cold plate attachment portion 134 that allows the stabilizing portion 136 to help stabilizes the cold plate 114 and even out the force from the first load portion 132a and the second load portion 132b to help create an even pressure on the heat source 104 (not shown) from the cold plate 114. More specifically, the first stabilizing portion 136a can have a length 146a and an angle 172a relative to the first cold plate attachment portion 134a and the second stabilizing portion 136b can have a length 146b and an angle 172b relative to the second cold plate attachment portion 134b. In an example, the length 146a and the angle 172a of the first stabilizing portion 136a may be the same length as the length 146b and the angle 172b of the second stabilizing portion 136b. In another example, the length 146a of the first stabilizing portion 136a may be a different length than the length 146b of the second stabilizing portion 136b and the angle 172a of the first stabilizing portion 136a may be a different angle than the angle 172b of the second stabilizing portion 136b. In an illustrative example, the length 146a of the first stabilizing portion 136a and the length 146b of the second stabilizing portion 136b may be between about five (5) millimeters to about twenty-five (25) millimeters and ranges therein (e.g., between about five (5) and about twenty (20) millimeters, or between about ten (10) and about fifteen (15) millimeters), depending on design choice and design constraints. The angle of the first stabilizing portion 136a may be between about one degree (1°) to about forty-five degrees (45°) relative to the first cold plate attachment portion 134a and ranges therein (e.g., between about five degrees (5°) and about twenty degrees (20°), or between about ten degrees (10°) and about forty degrees (40°)), depending on design choice and design constraints and the angle 172b of the second stabilizing portion 136b may be between about one degree (1°) to about forty-five degrees (45°) relative to the second cold plate attachment portion 134b and ranges therein (e.g., between about five degrees (5°) and about twenty degrees (20°), or between about ten degrees (10°) and about forty degrees (40°)), depending on design choice and design constraints. However, the length 142a of the first stabilizing portion 136a, the second stabilizing portion 136b, the angle 172a of the first stabilizing portion 136a relative to the cold plate 114, and the angle 172b of the second stabilizing portion 136b relative to the cold plate 114 depends on design constraints, the desired force to pull the cold plate 114 towards the support structure 118 cold plate 114, and the amount of needed stabilization for the cold plate 114. The length 146a of the first stabilizing portion 136a and the length 146b of the second stabilizing portion 136b do not need to be the same or equal. The angle of the first stabilizing portion 136a relative to the first cold plate attachment portion 134a and the angle 172b of the second stabilizing portion 136b m relative to the second cold plate attachment portion 134b do not need to be the same or equal.

The feet 138 can have a length 148 that allows the feet to help provide a base for cold plate attachment with stabilizing arm 108 and help to create an even pressure on the heat source 104 (not shown) from the cold plate 114. More specifically, the first foot 138a can have a length 148a and the second foot 138b can have a length 148b. In an example, the length 148a of the first foot 138a may be the same length as the length 148b of the second foot 138b. In another example, the length 148a of the first foot 138a may be a different length than the length 148b of the second foot 138b. In an illustrative example, the length 148a of the first foot 138a and the length 148b of the second foot 138b may be between about zero (0) millimeters (or the first foot 138a and/or the second foot 138b are not present) to about ten (10) millimeters and ranges therein (e.g., between about one (1) and about five (5) millimeters, or between about eight (8) and about ten (10) millimeters), depending on design choice and design constraints. The length 148a of the first foot 138a and the length 148b of the second foot 138b do not need to be the same or equal.

Figure 5:
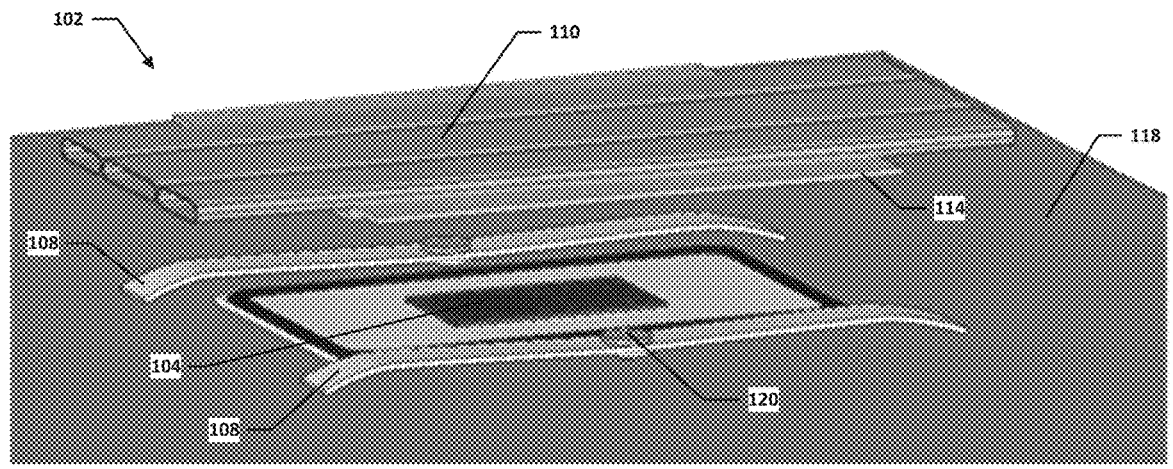
FIG. 5 is a simplified perspective view of a portion of a system to enable a cold plate attachment with stabilizing arm, in accordance with an embodiment of the present disclosure.

Turning to FIG. 5, FIG. 5 is a simplified partially exploded perspective view of a portion of the electronic device 102 with the cold plate attachment with stabilizing arm 108. In an example, the electronic device 102 can include the heat source 104, the cold plate attachments with stabilizing arms 108, and the heat pipe 110. The cold plate attachments with stabilizing arms 108 can be coupled to the cold plate 114. Each of the cold plate attachments with stabilizing arms 108 can be secured to the support structure 118 using the support structure fastener 120. In addition, each of the cold plate attachments with stabilizing arms 108 can be secured to the cold plate (e.g., using cold plate fasteners 122 not shown).

Each of the support structure fasteners 120 can go through the support structure 118 to help secure the cold plate attachment with stabilizing arm 108 to the support structure 118. When the cold plate attachments with stabilizing arms 108 are secured to the support structure 118, a portion of the cold plate attachments with stabilizing arms 108 extend from the support structure 118 to the cold plate 114. Because the cold plate attachments with stabilizing arms 108 are secured to the cold plate 114, the cold plate attachments with stabilizing arms 108 pull the cold plate 114 towards the support structure 118 and the heat source 104 that is over the support structure 118.

Also, a portion of the cold plate attachments with stabilizing arms 108 extends from the cold plate 114 back to the support structure 118 and acts as a stabilizing arm to help create an even pressure on the heat source 104 from the cold plate 114. The portion of the cold plate attachments with stabilizing arms 108 that extends from the cold plate 114 back to the support structure 118 are not secured to the support structure 118 but rather sit on the support structure 118 and function as stabilizing springs that stabilizes the cold plate 114 and even out the pressure on the heat source 104 from the cold plate 114. Because the portion of the cold plate attachments with stabilizing arms 108 that extend from the cold plate 114 back to the support structure 118 are not secured to the support structure 118 but rather sit on the support structure 118, traces and other components can be located on the PCB under the area of the cold plate attachments with stabilizing arms 108 and there is only one hole in the support structure 118 for each of the cold plate attachments with stabilizing arms 108.

Figure 6:
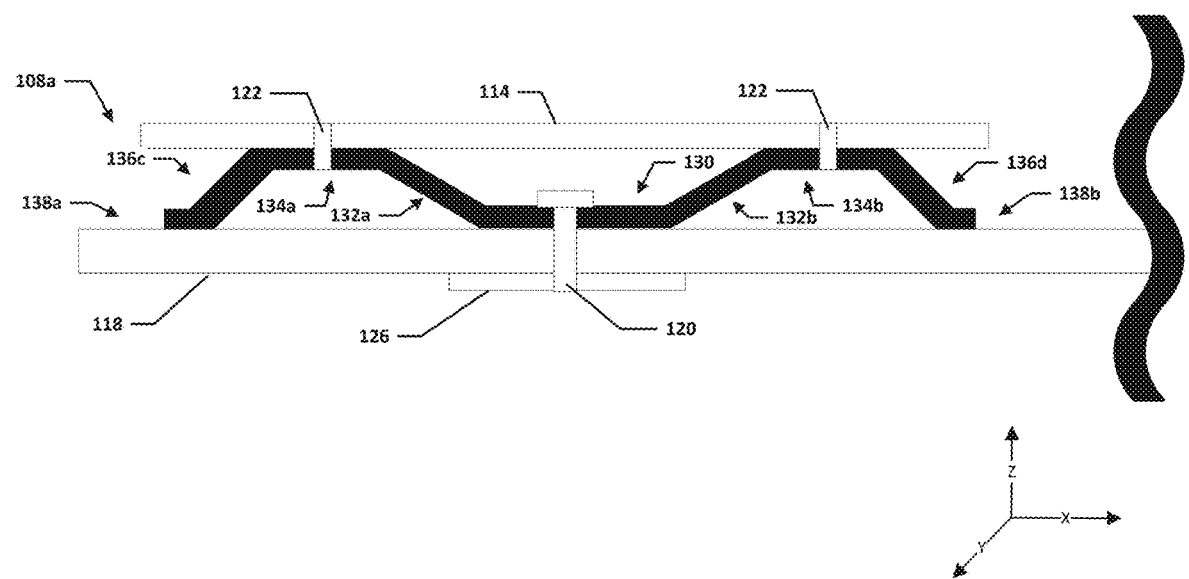
FIG. 6 is a simplified block diagram side view of a portion of a system to enable a cold plate attachment with stabilizing arm, in accordance with an embodiment of the present disclosure.

Turning to FIG. 6, FIG. 6 is a simplified side view of a cold plate attachment with stabilizing arm 108a, in accordance with an embodiment of the present disclosure. The cold plate attachment with stabilizing arm 108a can include the support structure attachment portion 130, the load portion 132, the cold plate attachment portion 134, the stabilizing portion 136, and the feet 138. More specifically, as illustrated in FIG. 5, the cold plate attachment with stabilizing arm 108a can include the support structure attachment portion 130, the first load portion 132a, the second load portion 132b, the first cold plate attachment portion 134a, the second cold plate attachment portion 134b, a first stabilizing portion 136c, a second stabilizing portion 136d, the first foot 138a, and the second foot 138b.

The cold plate attachment with stabilizing arm 108a can be coupled to the support structure 118 using the support structure fastener 120. In an example, as illustrated in FIG. 6, the support structure fastener 120 can go through the support structure attachment portion 130 and through the support structure 118. In some examples, the support structure fastener 120 can also go through the support plate 126.

As illustrated in FIG. 6, the first load portion 132a of the cold plate attachment with stabilizing arm 108a can extend from the support structure attachment portion 130 to the first cold plate attachment portion 134a and the second load portion 132b of the cold plate attachment with stabilizing arm 108a can extend from the support structure attachment portion 130 to the second cold plate attachment portion 134b. The first cold plate attachment portion 134a and the second cold plate attachment portion 134b of the cold plate attachment with stabilizing arm 108a can be coupled to the cold plate 114 using the cold plate fasteners 122. In addition, the first stabilizing portion 136c of the cold plate attachment with stabilizing arm 108a can extend from the first cold plate attachment portion 134a to the support structure 118 and the second stabilizing portion 136d of the cold plate attachment with stabilizing arm 108a can extend from the second cold plate attachment portion 134b to the support structure 118. Due to the angle, shape, material, etc. of the first stabilizing portion 136c and the second stabilizing portion 136d, a counter force on the cold plate 114 is created. The counter force can help stabilizes the cold plate 114 and even out the force from the first load portion 132a and the second load portion 132b to help create an even pressure on the heat source 104 from the cold plate 114.

Also, as illustrated in FIG. 6, the first foot 138a of the cold plate attachment with stabilizing arm 108a can extend from the first stabilizing portion 136c and the second foot 138b of the cold plate attachment with stabilizing arm 108a can extend from the second stabilizing portion 136d along a plane that is substantially parallel to a plane that includes a surface of support structure 118. The first foot 138a and the second foot 138b are not attached, coupled, or otherwise secured to the support structure 118 so no additional through holes are created in the support structure and traces can extend in and around the location of the first foot 138a and the second foot 138b. The first foot 138a of the cold plate attachment with stabilizing arm 108a helps to stabilize the first stabilizing portion 136c and the second foot 138b of the cold plate attachment with stabilizing arm 108a helps to stabilize the second stabilizing portion 136d and the first foot 138a and second foot 138b help to create an even pressure on the heat source 104 from the cold plate 114. As illustrated in FIG. 6, the first stabilizing portion 136c, the second stabilizing portion 136d, the first foot 138a, and the second foot 138b do not extend past the cold plate 114 and do not occupy space in the Z-direction past the outside edges of the cold plate 114. This helps to reduce the area of the support structure 118 and the space above the support structure 118 (in the Z-direction) that is occupied by the cold plate attachment with stabilizing arm 108a.

Figure 7:
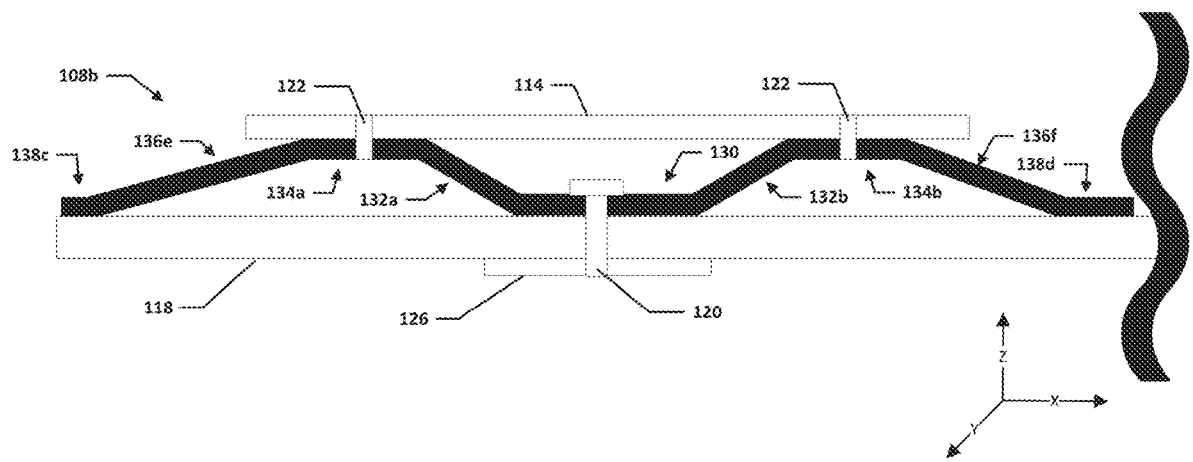
FIG. 7 is a simplified block diagram side view of a portion of a system to enable a cold plate attachment with stabilizing arm, in accordance with an embodiment of the present disclosure.

Turning to FIG. 7, FIG. 7 is a simplified side view of a cold plate attachment with stabilizing arm 108b, in accordance with an embodiment of the present disclosure. The cold plate attachment with stabilizing arm 108b can include the support structure attachment portion 130, the load portion 132, the cold plate attachment portion 134, the stabilizing portion 136, and the feet 138. More specifically, as illustrated in FIG. 7, the cold plate attachment with stabilizing arm 108b can include the support structure attachment portion 130, the first load portion 132a, the second load portion 132b, the first cold plate attachment portion 134a, the second cold plate attachment portion 134b, a first stabilizing portion 136e, a second stabilizing portion 136f, a first foot 138c, and a second foot 138d. As illustrated in FIG. 7, the length of the first foot 138c is shorter than the length of the second foot 138d The cold plate attachment with stabilizing arm 108b can be coupled to the support structure 118 using the support structure fastener 120. In an example, as illustrated in FIG. 7, the support structure fastener 120 can go through the support structure attachment portion 130 and through the support structure 118. In some examples, the support structure fastener 120 can also go through the support plate 126.

As illustrated in FIG. 7, the first load portion 132a of the cold plate attachment with stabilizing arm 108b can extend from the support structure attachment portion 130 to the first cold plate attachment portion 134a and the second load portion 132b of the cold plate attachment with stabilizing arm 108b can extend from the support structure attachment portion 130 to the second cold plate attachment portion 134b from the support structure attachment portion 130 to the cold plate 114. The first cold plate attachment portion 134a and the second cold plate attachment portion 134b of the cold plate attachment with stabilizing arm 108b can be coupled to the cold plate 114 using the cold plate fasteners 122. In addition, the first stabilizing portion 136e of the cold plate attachment with stabilizing arm 108b can extend from the first cold plate attachment portion 134a to the support structure 118 and the second stabilizing portion 136f of the cold plate attachment with stabilizing arm 108b can extend from the second cold plate attachment portion 143b to the support structure 118. Due to the angle, shape, material, etc. of the first stabilizing portion 136e and the second stabilizing portion 136f, a counter force on the cold plate 114 is created. The counter force can help stabilizes the cold plate 114 and even out the force from the first load portion 132a and the second load portion 132b to help create an even pressure on the heat source 104 from the cold plate 114.

Also, as illustrated in FIG. 7, the first foot 138c of the cold plate attachment with stabilizing arm 108b can extend from the first stabilizing portion 136e and the second foot 138d of the cold plate attachment with stabilizing arm 108b can extend from the second stabilizing portion 136f along a plane that is substantially parallel to a plane that includes a surface of support structure 118. The first foot 138c and the second foot 138d are not attached, coupled, or otherwise secured to the support structure 118 so no additional through holes are created in the support structure and traces can extend in and around the location of the first foot 138c and the second foot 138d. The first foot 138c and the second foot 138d of the cold plate attachment with stabilizing arm 108b help to stabilize the first stabilizing portion 136a and the second stabilizing portion 136b of the cold plate attachment with stabilizing arm 108b and help create an even pressure on the heat source 104 from the cold plate 114.

In some example, additional support and stabilization may be needed to help create an even pressure on the heat source 104 from the cold plate 114. As illustrated in FIG. 7, the first stabilizing portion 136e and the second stabilizing portion 136f can extend to help create the stabilization (e.g., as compared to the first stabilizing portion 136c and the second stabilizing portion 136d illustrated in FIG. 6, the first stabilizing portion 136e and the second stabilizing portion 136f have been extended to help create the additional stabilization). In addition, the first foot 138c and/or the second foot 138d can also be extended to help create additional stabilization. More specifically, the second foot 138*d* has been extended as compared to the first foot 138*c*. The extension of the first stabilizing portion 136*e*, the second stabilizing portion 136*f*, the first foot 138*c*, and/or the second foot 138*d* can help to create additional stability and, in some examples, can be used to accommodate asymmetric heat sources where it can be difficult to apply an even pressure to asymmetric the heat sources.

Figure 8:
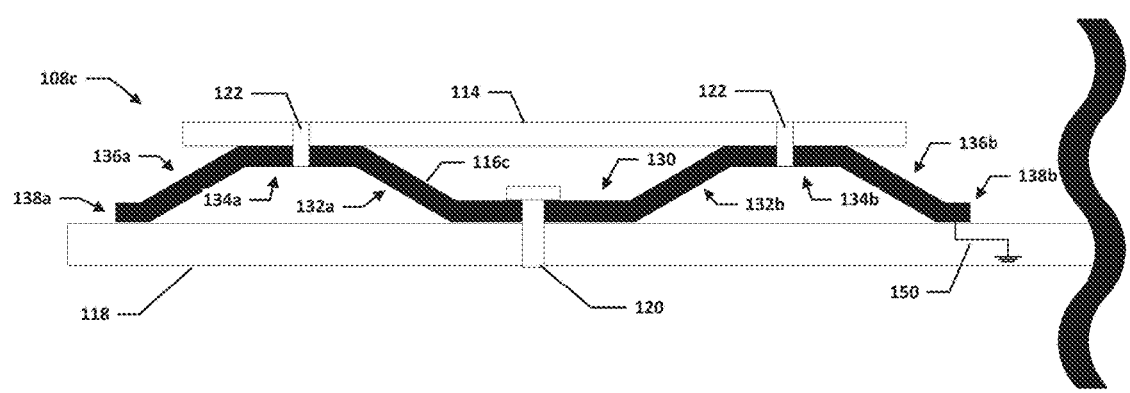
FIG. 8 is a simplified block diagram side view of a portion of a system to enable a cold plate attachment with stabilizing arm, in accordance with an embodiment of the present disclosure.

Turning to FIG. 8, FIG. 8 is a simplified side view of a cold plate attachment with stabilizing arm 108*c*, in accordance with an embodiment of the present disclosure. The cold plate attachment with stabilizing arm 108*c* can include the support structure attachment portion 130, the load portion 132, the cold plate attachment portion 134, the stabilizing portion 136, and the feet 138. More specifically, the cold plate attachment with stabilizing arm 108*c* can include the support structure attachment portion 130, the first load portion 132*a*, the second load portion 132*b*, the first cold plate attachment portion 134*a*, the second cold plate attachment portion 134*b*, the first stabilizing portion 136*a*, the second stabilizing portion 136*b*, the first foot 138*a*, and the second foot 138*b*. The support structure 118 can include a ground plane and the first foot 138*a* and/or the second foot 138*b* can be coupled to the ground plane in the substrate. For example, as illustrated in FIG. 8, the second foot 128*b* is coupled to a ground 150. The ground 150 can be part of the ground plane in the support structure 118.

Figure 9:
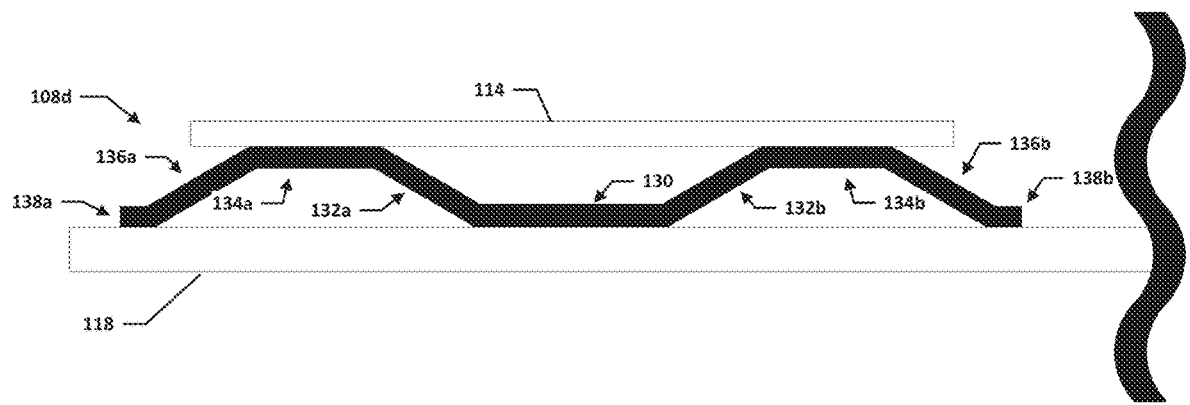
FIG. 9 is a simplified block diagram side view of a portion of a system to enable a cold plate attachment with stabilizing arm, in accordance with an embodiment of the present disclosure.

Turning to FIG. 9, FIG. 9 is a simplified side view of a cold plate attachment with stabilizing arm 108*d*, in accordance with an embodiment of the present disclosure. The cold plate attachment with stabilizing arm 108*d* can include the support structure attachment portion 130, the load portion 132, the cold plate attachment portion 134, the stabilizing portion 136, and the feet 138. More specifically, the cold plate attachment with stabilizing arm 108*d* can include the support structure attachment portion 130, the first load portion 132*a*, the second load portion 132*b*, the first cold plate attachment portion 134*a*, the second cold plate attachment portion 134*b*, the first stabilizing portion 136*a*, the second stabilizing portion 136*b*, the first foot 138*a*, and the second foot 138*b*.

The cold plate attachment with stabilizing arm 108*d* can be coupled to the support structure 118 using solder, tape, a weld, a mechanical locking feature, or some other material that can help to couple the cold plate attachment with stabilizing arm 108*d* to the support structure 118 (note that the support structure fastener 120 illustrated in FIG. 2 and other figures is not present and there is no though hole in the support structure 118). The first load portion 132*a* of the cold plate attachment with stabilizing arm 108*d* can extend from the support structure attachment portion 130 to the first cold plate attachment portion 134*a* and the second load portion 132*b* of the cold plate attachment with stabilizing arm 108*d* can extend from the support structure attachment portion 130 to the second cold plate attachment portion 134*b*. The first cold plate attachment portion 134*a* and the second cold plate attachment portion 134*b* of the cold plate attachment with stabilizing arm 108*d* can be coupled to the cold plate 114 using solder, tape, a weld, a mechanical locking feature, or some other material that can help to couple the first cold plate attachment portion 134*a* and the second cold plate attachment portion 134*b* to the cold plate 114 (note that the cold plate fasteners 122 illustrated in FIG. 2 and other figures is not present). The first stabilizing portion 136*a* of the cold plate attachment with stabilizing arm 108*d* can extend from the first cold plate attachment portion 134*a* to the support structure 118 and the second stabilizing portion 136*b* of the cold plate attachment with stabilizing arm 108*d* can extend from the second cold plate attachment portion 134*b* to the support structure 118. The first foot 138*a* of the cold plate attachment with stabilizing arm 108*d* can extend from the first stabilizing portion 136*a* and the second foot 138*b* of the cold plate attachment with stabilizing arm 108*d* can extend from the second stabilizing portion 136*b* along a plane that is substantially parallel to a plane that includes a surface of support structure 118. The first foot 138*a* and the second foot 138*b* are not attached, coupled, or otherwise secured to the support structure 118 so no additional holes are created in the support structure and traces can extend in and around the location of the first foot 138*a* and the second foot 138*b*.

Figure 10:
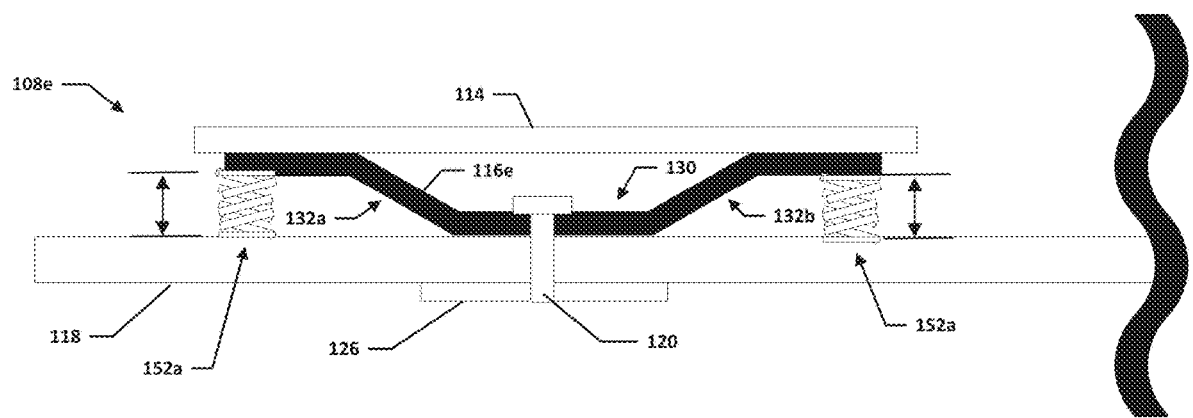
FIG. 10 is a simplified block diagram side view of a portion of a system to enable a cold plate attachment with stabilizing arm, in accordance with an embodiment of the present disclosure.

Turning to FIG. 10, FIG. 10 is a simplified side view of a cold plate attachment with stabilizing arm 108*e*, in accordance with an embodiment of the present disclosure. The cold plate attachment with stabilizing arm 108*e* can include the support structure attachment portion 130, the load portion 132, the cold plate attachment portion 134, and a stabilizing spring 152. More specifically, as illustrated in FIG. 10, the cold plate attachment with stabilizing arm 108*e* can include the support structure attachment portion 130, the first load portion 132*a*, the second load portion 132*b*, the first cold plate attachment portion 134*a*, the second cold plate attachment portion 134*b*, a first spring 152*a*, and a second spring 152*b*.

The cold plate attachment with stabilizing arm 108*e* can be coupled to the support structure 118 using the support structure fastener 120. In an example, as illustrated in FIG. 10, the support structure fastener 120 can go through the support structure attachment portion 130 and through the support structure 118. In some examples, the support structure fastener 120 can also go through the support plate 126.

As illustrated in FIG. 10, the first load portion 132*a* of the cold plate attachment with stabilizing arm 108 can extend from the support structure attachment portion 130 to the first cold plate attachment portion 134*a* and the second load portion 132*b* of the cold plate attachment with stabilizing arm 108*e* can extend from the support structure attachment portion 130 to the second cold plate attachment portion 134*b*. The first cold plate attachment portion 134*a* and the second cold plate attachment portion 134*b* of the cold plate attachment with stabilizing arm 108*e* can be coupled to the cold plate 114 (e.g., using the cold plate fasteners 122 (not shown) or using solder, tape, a weld, a mechanical locking feature, or some other material that can help to couple the first cold plate attachment portion 134*a* and the second cold plate attachment portion 134*b* to the cold plate 114). In addition, the first spring 152*a* and the second spring 152*b* of the cold plate attachment with stabilizing arm 108*e* can extend from the cold plate 114 to the support structure 118. Due to the shape, material, spring constant, etc. of the first spring 152*a* and the second spring 152*b*, a counter force on the cold plate 114 is created. The counter force can help stabilizes the cold plate 114 and even out the force from the first load portion 132*a* and the second load portion 132*b* to help create an even pressure on the heat source 104 (not shown) from the cold plate 114. In an example, as illustrated in FIG. 10, the first spring 152*a* and the second spring 152*b* do not extend past the cold plate 114 to help reduce the area of the support structure 118 that is occupied by the cold plate attachment with stabilizing arm 108*e*.

Figure 11:
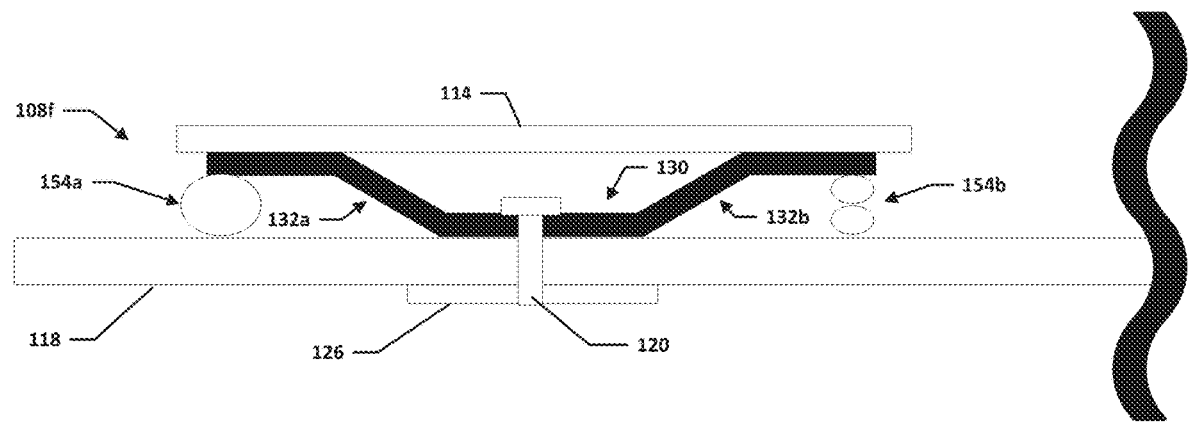
FIG. 11 is a simplified block diagram side view of a portion of a system to enable a cold plate attachment with stabilizing arm, in accordance with an embodiment of the present disclosure.

Turning to FIG. 11, FIG. 11 is a simplified side view of a cold plate attachment with stabilizing arm 108*f*, in accordance with an embodiment of the present disclosure. The cold plate attachment with stabilizing arm 108*f* can include the support structure attachment portion 130, the load portion 132, the cold plate attachment portion 134, and a stabilizing structure 154. More specifically, as illustrated in FIG. 11, the cold plate attachment with stabilizing arm 108f can include the support structure attachment portion 130, the first load portion 132a, the second load portion 132b, the first cold plate attachment portion 134a, the second cold plate attachment portion 134b, a first stabilizing structure 154a, and a second stabilizing structure 154b. In some examples, the first stabilizing structure 154a and the second stabilizing structure may be an elastomeric material that can flex and compress to help stabilize the cold plate 114 and even out the force from the first load portion 132a and the second load portion 132b to help create an even pressure on the heat source 104 (not shown) from the cold plate 114. For example, as illustrated in FIG. 11, the first stabilizing structure 154a has a round profile like an elastomeric ball or an elastomeric ring and the second stabilizing structure may be stacked elastomeric rings or a plurality of stacked elastomeric rings or spheres.

The cold plate attachment with stabilizing arm 108e can be coupled to the support structure 118 using the support structure fastener 120. In an example, as illustrated in FIG. 11, the support structure fastener 120 can go through the support structure attachment portion 130 and through the support structure 118. In some examples, the support structure fastener 120 can also go through the support plate 126.

As illustrated in FIG. 11, the first load portion 132a of the cold plate attachment with stabilizing arm 108f can extend from the support structure attachment portion 130 to the first cold plate attachment portion 134a and the second load portion 132b of the cold plate attachment with stabilizing arm 108f can extend from the support structure attachment portion 130 to the second cold plate attachment portion 134b. The first cold plate attachment portion 134a and the second cold plate attachment portion 134b of the cold plate attachment with stabilizing arm 108e can be coupled to the cold plate 114 (e.g., using the cold plate fasteners 122 (not shown) or using solder, tape, a weld, a mechanical locking feature, or some other material that can help to couple the first cold plate attachment portion 134a and the second cold plate attachment portion 134b to the cold plate 114). In addition, the first stabilizing structure 154a and the second stabilizing structure 154b of the cold plate attachment with stabilizing arm 108f can extend from the cold plate 114 to the support structure 118. Due to the shape, material, elastic constant, etc. of the first stabilizing structure 154a and the second stabilizing structure 154b, a counter force on the cold plate 114 is created. The counter force can help stabilizes the cold plate 114 and even out the force from the first load portion 132a and the second load portion 132b to help create an even pressure on the heat source 104 from the cold plate 114. In an example, as illustrated in FIG. 11, the first stabilizing structure 154a and the second stabilizing structure 154b do not extend past the cold plate 114 to help reduce the area of the support structure 118 that is occupied by the cold plate attachment with stabilizing arm 108f.

Figure 12:
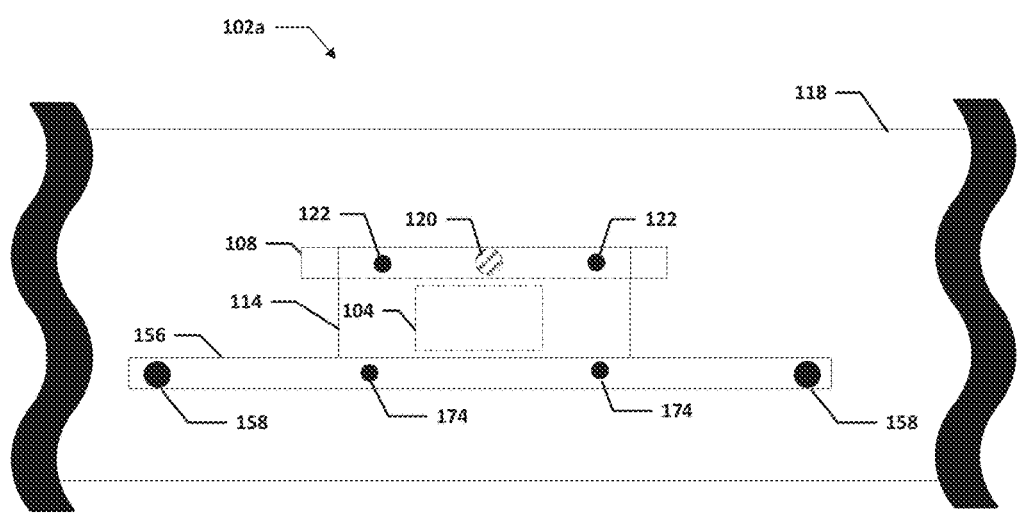
FIG. 12 is a simplified block diagram top view of a portion of a system to enable a cold plate attachment with stabilizing arm, in accordance with an embodiment of the present disclosure.

Turning to FIG. 12, FIG. 12 is a simplified block diagram of a portion of an electronic device 102a that includes a cold plate attachment with stabilizing arm 108, in accordance with an embodiment of the present disclosure. In an example, the electronic device 102a can include the heat source 104, the cold plate attachment with stabilizing arm 108, and one part or side of a four-point attachment system 156.

The cold plate attachment with stabilizing arm 108 can be secured to the support structure 118 using the support structure fastener 120 or by using solder, tape, a weld, a mechanical locking feature, or some other material that can help to couple the cold plate attachment with stabilizing arm 108 to the support structure 118. In addition, cold plate attachment with stabilizing arm 108 can be secured to the cold plate 114 using cold plate fasteners 122 or by using solder, tape, a weld, a mechanical locking feature, or some other material that can help to couple the cold plate attachment with stabilizing arm 108 to the cold plate 114.

The four-point attachment system 156 can be secured to the support structure 118 using two fasteners 158. In addition, the four-point attachment system 156 can be secured to the cold plate 114 using attachments 174. As illustrated in FIG. 11, the four-point attachment system 156 requires two holes in the support structure 118 while the cold plate attachment with stabilizing arm 108 only requires one. In addition, the four-point attachment system 156 occupies a relatively large amount of space on and above the support structure 118 as compared to the cold plate attachment with stabilizing arm 108.

Figure 13:
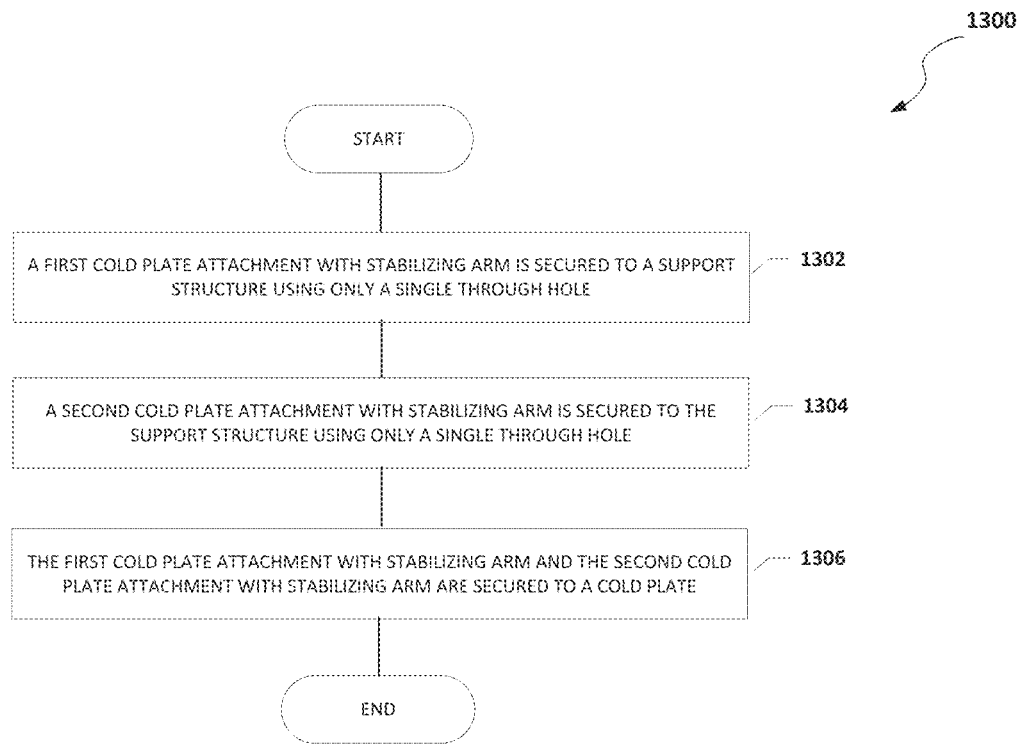
FIG. 13 is a simplified flowchart illustrating potential operations that may be associated with the system in accordance with an embodiment of the present disclosure.

Turning to FIG. 13, FIG. 13 is an example flowchart illustrating possible operations of a flow 1300 that may be associated with a cold plate attachment with stabilizing arm, in accordance with an embodiment. At 1302, a first cold plate attachment with stabilizing arm is secured to a support structure using only a single through hole in the support structure. At 1304, a second cold plate attachment with stabilizing arm is secured to a support structure using only a single through hole in the support structure. At 1306, the first cold plate attachment with stabilizing arm and the second cold plate attachment with stabilizing arm are secured to a cold plate.

Figure 14:
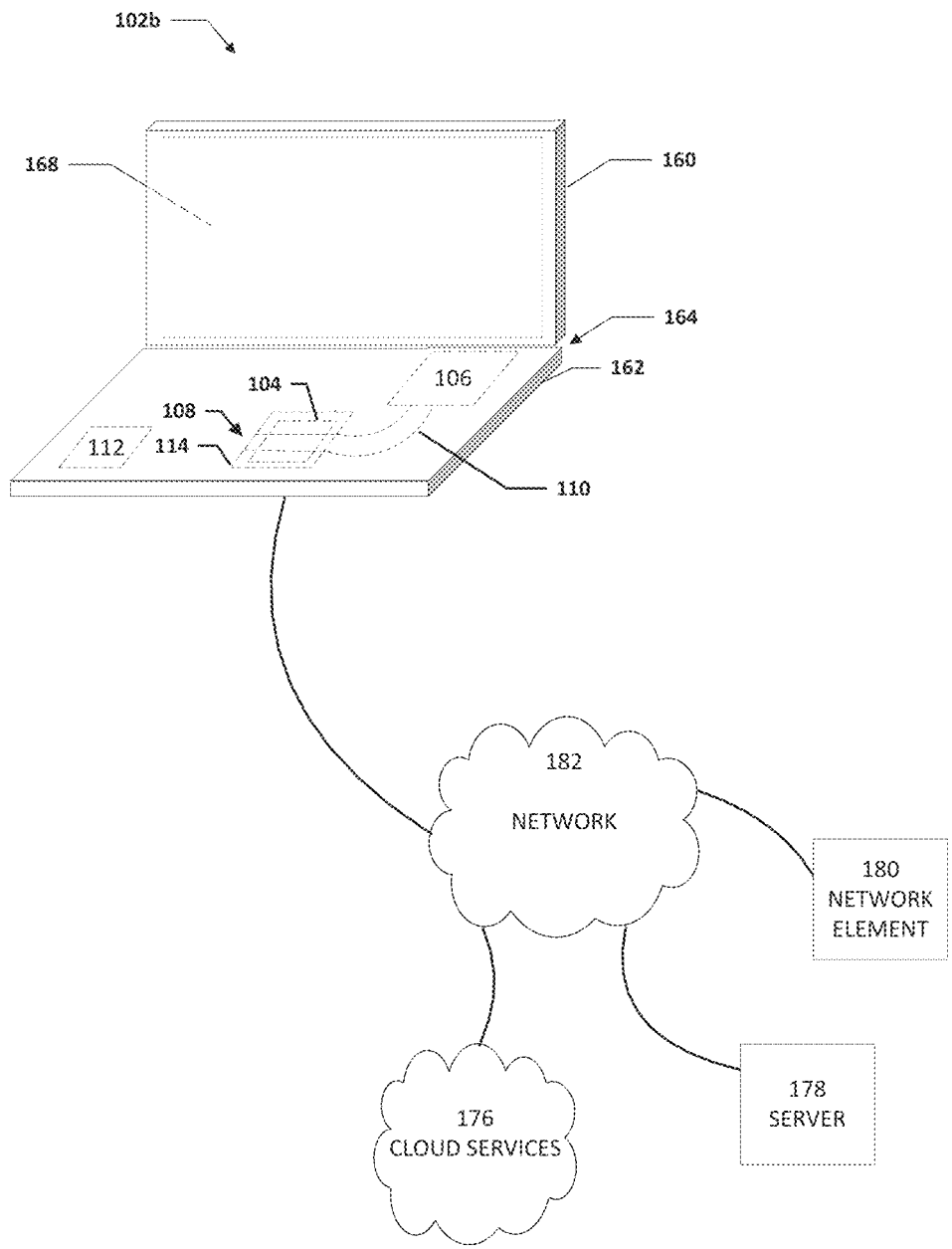
FIG. 14 is a simplified block diagram of a system that includes a cold plate attachment with stabilizing arm, in accordance with an embodiment of the present disclosure.

Turning to FIG. 14, FIG. 14 is a simplified block diagram of an electronic device 102b configured with the cold plate attachment with stabilizing arm 108, in accordance with an embodiment of the present disclosure. In an example, the electronic device 102b can include a first housing 160 and a second housing 162. The first housing 160 and the second housing 162 can be rotatably or pivotably coupled together using a hinge 164. The first housing 160 can include a display 168. The second housing 162 can include the heat source 104, the cold plate attachment with stabilizing arm 108, one or more heatsinks 106, one or more heat pipes 110, one or more electronic components 112, and the cold plate 114. The electronic device 102b (and the electronic device 102 and 102a) may be in communication with cloud services 176, one or more servers 178, and/or one or more network elements 180 using a network 182. In some examples, the electronic device 102b (and the electronic device 102 and 102a) may be a standalone device and not connected to the network 182 or another device Elements of FIG. 14 may be coupled to one another through one or more interfaces employing any suitable connections (wired or wireless), which provide viable pathways for network (e.g., the network 182, etc.) communications. Additionally, any one or more of these elements of FIG. 14 may be combined or removed from the architecture based on particular configuration needs. The network 182 may include a configuration capable of transmission control protocol/Internet protocol (TCP/IP) communications for the transmission or reception of packets in a network. The electronic device 102b (and the electronic device 102 and 102a) may also operate in conjunction with a user datagram protocol/IP (UDP/IP) or any other suitable protocol where appropriate and based on particular needs.

Turning to the infrastructure of FIG. 14, the network 182 represents a series of points or nodes of interconnected communication paths for receiving and transmitting packets of information. The network 182 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In the network 182, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, the electronic devices 102, 102a, and 102b are meant to encompass a computer, laptop computer, a laptop or electronic notebook, a personal digital assistant (PDA), a cellular telephone, a smartphone, network elements, network appliances, servers, routers, switches, gateways, bridges, load balancers, processors, modules, or any other device, component, element, or object that includes a heat source, a cold plate, and a support structure (e.g., a PCB). Each of the electronic devices 102, 102a, and 102b may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of the electronic devices 102, 102a, and 102b may include virtual elements.

In regards to the internal structure, each of the electronic devices 102, 102a, and 102b can include memory elements for storing information to be used in operations. Each of the electronic devices 102, 102a, and 102b may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out activities.

Additionally, the one or more heat sources 104 may be or include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on a substrate, such as a non-semiconductor substrate or a semiconductor substrate. In some examples, the support structure 118 is a substrate such as a non-semiconductor substrate or a semiconductor substrate. In other examples, the support structure may be a chassis of an electronic device. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although the cold plate attachment with stabilizing arm have been illustrated with reference to particular elements and operations, these elements and operations may be replaced by any suitable structure that achieves the intended functionality of the cold plate attachment with stabilizing arm.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, an electronic device can include a printed circuit board, a heat source located on the printed circuit board, a cold plate over the heat source, and a pair of cold plate attachments with stabilizing arms. Each of the pair of cold plate attachments with stabilizing arms can include a printed circuit board attachment portion secured to the printed circuit board using only a single through hole, a load portion that extends from the printed circuit board attachment portion towards the cold plate, a cold plate attachment portion that secures the cold plate attachment with stabilizing arm to the cold plate, and a stabilizing portion that extends from the cold plate attachment portion to the printed circuit board.

In Example A2, the subject matter of Example A1 can optionally include where the printed circuit board attachment portion is located in an approximate middle portion of the cold plate attachment with stabilizing arm.

In Example A3, the subject matter of any one of Examples A1-A2 can optionally include a first load portion that extends from a first side of the printed circuit board attachment portion to the cold plate attachment portion and a second load portion that extends from a second side of the printed circuit board attachment portion to the cold plate attachment portion.

In Example A4, the subject matter of any one of Examples A1-A3 can optionally include where the load portion pulls the cold plate towards the printed circuit board and causes the cold plate to apply pressure onto the heat source.

In Example A5, the subject matter of any one of Examples A1-A4 can optionally include where the stabilizing portion is not secured to the printed circuit board.

In Example A6, the subject matter of any one of Examples A1-A5 can optionally include feet that extend from the stabilizing portion.

In Example A7, the subject matter of any one of Examples A1-A6 can optionally include where the stabilizing portion does not extend past the cold plate.

Example AA1 is a cold plate attachment with stabilizing arm including a support structure attachment portion secured to a support structure, a load portion that extends from the support structure to a cold plate, a cold plate attachment portion that secures the cold plate attachment with stabilizing arm to the cold plate, and a stabilizing portion that extends from the cold plate attachment portion to the support structure.

In Example AA2, the subject matter of Example AA1 can optionally include feet that extend from the stabilizing portion.

In Example AA3, the subject matter of any one of the Examples AA1-AA2 can optionally include where the load portion pulls the cold plate towards the support structure.

In Example AA4, the subject matter of any one of the Examples AA1-AA3 can optionally include where the stabilizing portion provides a counter force on the cold plate.

In Example AA5, the subject matter of any one of the Examples AA1-AA4 can optionally include where the stabilizing portion evens out a force on the cold plate that is created by the load portion.

In Example AA6, the subject matter of any one of the Examples AA1-AA5 can optionally include where the support structure attachment portion is secured to the support structure using only one through hole in the support structure.

In Example AA7, the subject matter of any one of the Examples AA1-AA6 can optionally include where the cold plate attachment with stabilizing arm is located in a laptop computer.

Example M1 is a method including securing a first cold plate attachment with stabilizing arm to a printed circuit board using a single through hole in the printed circuit board and securing the first cold plate attachment with stabilizing arm to a cold plate using a cold plate attachment portion, wherein a load portion extends from the printed circuit board attachment portion towards a cold plate and a stabilizing portion extends from the cold plate attachment portion to the printed circuit board. The first cold plate attachment with stabilizing arm includes the printed circuit board attachment portion secured to the printed circuit board using only the single through hole, the load portion, the cold plate attachment portion, and the stabilizing portion.

In Example M2, the subject matter of Example M1 can optionally include before securing the first cold plate attachment with stabilizing arm to the cold plate, securing a second cold plate attachment with stabilizing arm to a printed circuit board using a second single through hole in the printed circuit board, wherein the first cold plate attachment with stabilizing arm and the second cold plate attachment with stabilizing arm are secured to the printed circuit board using only two through holes and securing the second cold plate attachment with stabilizing arm to the cold plate using a second cold plate attachment portion.

In Example M3, the subject matter of any one of the Examples M1-M2 can optionally include where the load portion pulls the cold plate towards the printed circuit board.

In Example M4, the subject matter of any one of the Examples M1-M3 can optionally include where the stabilizing portion provides a counter force on the cold plate.

In Example M5, the subject matter of any one of the Examples M1-M4 can optionally include where the first cold plate attachment with stabilizing arm further includes feet that extend from the stabilizing portion.

In Example M6, the subject matter of any one of the Examples M1-M5 can optionally include where the cold plate is over a heat source and the load portion pulls the cold plate towards the heat source and the stabilizing portion provides a counter force on the cold plate that helps to distribute a load on the heat source from the cold plate.

What is claimed is:

1. An electronic device comprising:
   a printed circuit board;
   a heat source located on the printed circuit board;
   a cold plate over the heat source; and
   a pair of cold plate attachments with stabilizing arms, wherein each of the pair of cold plate attachments with stabilizing arms include:
      a printed circuit board attachment portion secured to the printed circuit board using only a single through hole;
      a load portion that extends from the printed circuit board attachment portion towards the cold plate;
      a cold plate attachment portion that secures the cold plate attachment with stabilizing arm to the cold plate; and
      a stabilizing portion that extends from the cold plate attachment portion to the printed circuit board.

2. The electronic device of claim 1, wherein the printed circuit board attachment portion is located in an approximate middle portion of the cold plate attachment with stabilizing arm.

3. The electronic device of claim 1, wherein the load portion includes:
   a first load portion that extends from a first side of the printed circuit board attachment portion to the cold plate attachment portion; and
   a second load portion that extends from a second side of the printed circuit board attachment portion to the cold plate attachment portion.

4. The electronic device of claim 1, wherein the load portion pulls the cold plate towards the printed circuit board and causes the cold plate to apply pressure onto the heat source.

5. The electronic device of claim 1, wherein the stabilizing portion is not secured to the printed circuit board.

6. The electronic device of claim 1, further comprising: feet that extend from the stabilizing portion.

7. The electronic device of claim 1, wherein the stabilizing portion does not extend past the cold plate.

8. A cold plate attachment with stabilizing arm comprising:
   a support structure attachment portion secured to a support structure;
   a load portion that extends from the support structure to a cold plate;
   a cold plate attachment portion that secures the cold plate attachment with stabilizing arm to the cold plate; and
   a stabilizing portion that extends from the cold plate attachment portion to the support structure.

9. The cold plate attachment with stabilizing arm of claim 8, further comprising:
   feet that extend from the stabilizing portion.

10. The cold plate attachment with stabilizing arm of claim 8, wherein the load portion pulls the cold plate towards the support structure.

11. The cold plate attachment with stabilizing arm of claim 8, wherein the stabilizing portion provides a counter force on the cold plate.

12. The cold plate attachment with stabilizing arm of claim 8, wherein the stabilizing portion evens out a force on the cold plate that is created by the load portion.

13. The cold plate attachment with stabilizing arm of claim 8, wherein the support structure attachment portion is secured to the support structure using only one through hole in the support structure.

14. The cold plate attachment with stabilizing arm of claim 8, wherein the cold plate attachment with stabilizing arm is located in a laptop computer.

15. A method comprising:
   securing a first cold plate attachment with stabilizing arm to a printed circuit board using a single through hole in the printed circuit board, wherein the first cold plate attachment with stabilizing arm includes:
      a printed circuit board attachment portion secured to the printed circuit board using only the single through hole;
      a load portion;
      a cold plate attachment portion; and
      a stabilizing portion; and
   securing the first cold plate attachment with stabilizing arm to a cold plate using the cold plate attachment portion, wherein the load portion extends from the printed circuit board attachment portion towards a cold plate and the stabilizing portion extends from the cold plate attachment portion to the printed circuit board.

16. The method of claim 15, further comprising:
   before securing the first cold plate attachment with stabilizing arm to the cold plate, securing a second cold plate attachment with stabilizing arm to a printed circuit board using a second single through hole in the printed circuit board, wherein the first cold plate attachment with stabilizing arm and the second cold plate attachment with stabilizing arm are secured to the printed circuit board using only two through holes; and
   securing the second cold plate attachment with stabilizing arm to the cold plate using a second cold plate attachment portion.

17. The method of claim 15, wherein the load portion pulls the cold plate towards the printed circuit board.

18. The method of claim 15, wherein the stabilizing portion provides a counter force on the cold plate.

19. The method of claim 15, wherein the first cold plate attachment with stabilizing arm further includes feet that extend from the stabilizing portion.

20. The method of claim 15, wherein the cold plate is over a heat source and the load portion pulls the cold plate towards the heat source and the stabilizing portion provides a counter force on the cold plate that helps to distribute a load on the heat source from the cold plate.

* * * * *